United States Patent
Teichmann et al.

(10) Patent No.: US 11,114,780 B2
(45) Date of Patent: *Sep. 7, 2021

(54) ELECTRONIC MODULE WITH AN ELECTRICALLY CONDUCTIVE PRESS-FIT TERMINAL HAVING A PRESS-FIT SECTION

(71) Applicant: Infineon Technologies AG, Neubiberg (DE)

(72) Inventors: Katharina Teichmann, Munich (DE); Alexander Herbrandt, Warstein (DE)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 16/854,589

(22) Filed: Apr. 21, 2020

(65) Prior Publication Data

US 2020/0251839 A1 Aug. 6, 2020

Related U.S. Application Data

(63) Continuation of application No. 15/981,647, filed on May 16, 2018, now Pat. No. 10,693,248.

(30) Foreign Application Priority Data

May 17, 2017 (EP) ..................... 17171551

(51) Int. Cl.
*H01R 12/58* (2011.01)
*H05K 1/14* (2006.01)
*H01B 1/02* (2006.01)
*H01R 4/58* (2006.01)
(Continued)

(52) U.S. Cl.
CPC .......... *H01R 12/585* (2013.01); *H01B 1/026* (2013.01); *H01R 4/58* (2013.01); *H01R 12/52* (2013.01);
(Continued)

(58) Field of Classification Search
CPC ........ H01R 12/585; H01R 4/58; H01R 12/52; H01R 13/03; H01B 1/026; H05K 5/0069;
(Continued)

(56) References Cited

U.S. PATENT DOCUMENTS 4,762,498 A 8/1988 Harting et al.
4,795,378 A 1/1989 Tomizu et al.
(Continued)

FOREIGN PATENT DOCUMENTS

CN 103109422 A 5/2013
CN 104080950 B 2/2017
(Continued)

OTHER PUBLICATIONS

"CuMg 018665 Copper Magnesium Alloy", https://www.kme.com/fileadmin/DOWNLOADCENTER/COPPE R% 20DIVISON/4%20 Industrial%20 Rolled/4_Alloys/STOL_R_78. pdf, Aug. 15, 2015, 1-5.
(Continued)

*Primary Examiner* — Hoa C Nguyen
(74) *Attorney, Agent, or Firm* — Murphy, Bilak & Homiller, PLLC

(57) ABSTRACT

An electronic assembly includes an electronic module and an electric part. The electronic module includes an electrically conductive press-fit terminal. The electrically conductive press-fit terminal has a press-fit section. The electric part has a contact hole. The press-fit section is inserted in the contact hole and plastically deformed therein, such that the press-fit section both mechanically and electrically contacts the electric part in the plastically deformed state. A corresponding method of assembly is also described.

26 Claims, 4 Drawing Sheets

(51) Int. Cl.
*H01R 12/52* (2011.01)
*H05K 5/00* (2006.01)
*H01R 13/03* (2006.01)
*H05K 1/03* (2006.01)

(52) U.S. Cl.
CPC .......... *H05K 1/144* (2013.01); *H05K 5/0069* (2013.01); *H01R 13/03* (2013.01); *H05K 1/0306* (2013.01); *H05K 2201/042* (2013.01); *H05K 2201/1059* (2013.01); *H05K 2201/10303* (2013.01); *H05K 2201/10318* (2013.01); *H05K 2201/10856* (2013.01)

(58) Field of Classification Search
CPC .......... H05K 2201/10303; H05K 2201/10318; H05K 2201/1059; H05K 1/0306; H05K 1/144; H05K 2201/10856; H05K 2201/042
See application file for complete search history.

(56) References Cited

U.S. PATENT DOCUMENTS

| | | | |
|---|---|---|---|
| 6,231,402 B1 | 5/2001 | Kikuchi | |
| 7,494,389 B1 | 2/2009 | Essert et al. | |
| 2005/0090155 A1 | 4/2005 | Blossfeld | |
| 2009/0010797 A1 | 1/2009 | Aruga et al. | |
| 2011/0111641 A1 | 5/2011 | Nakazawa et al. | |
| 2011/0256749 A1 | 10/2011 | Bayerer | |
| 2016/0336245 A1 | 11/2016 | Egusa et al. | |
| 2017/0054235 A1 | 2/2017 | Pola | |
| 2017/0085016 A1 | 3/2017 | Sasayama et al. | |
| 2017/0204501 A1* | 7/2017 | Allmendinger | C22C 9/04 |
| 2017/0237188 A1* | 8/2017 | Iwasaki | H01R 4/10 439/84 |

FOREIGN PATENT DOCUMENTS

| | | |
|---|---|---|
| DE | 3220781 A1 | 12/1983 |
| DE | 102006057143 A1 | 6/2008 |
| WO | 2015165914 A1 | 11/2015 |

OTHER PUBLICATIONS

Mattsson, Joakim, et al., "Press-Fit Technology", Tyco Electronics AMP GmbH, TE Connectivity, TE Automotive, White Paper, accessed online May 16, 2018 at http://www.te.com/content/dam/te-com/documents/automotive/global/whitepaper-pressfit-072014.pdf.

* cited by examiner

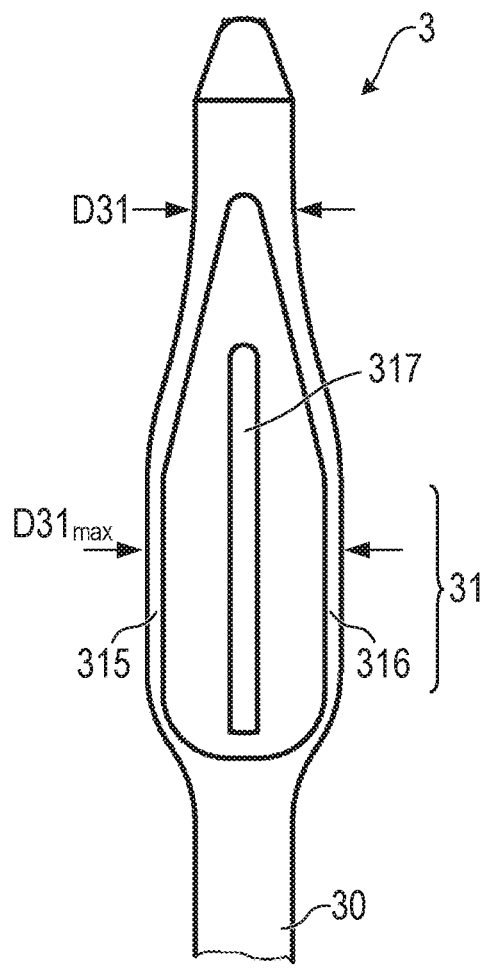
FIG 7A
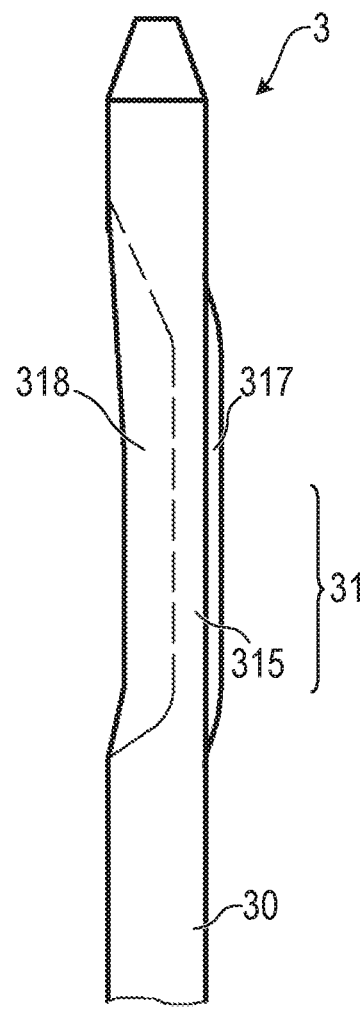
FIG 7B
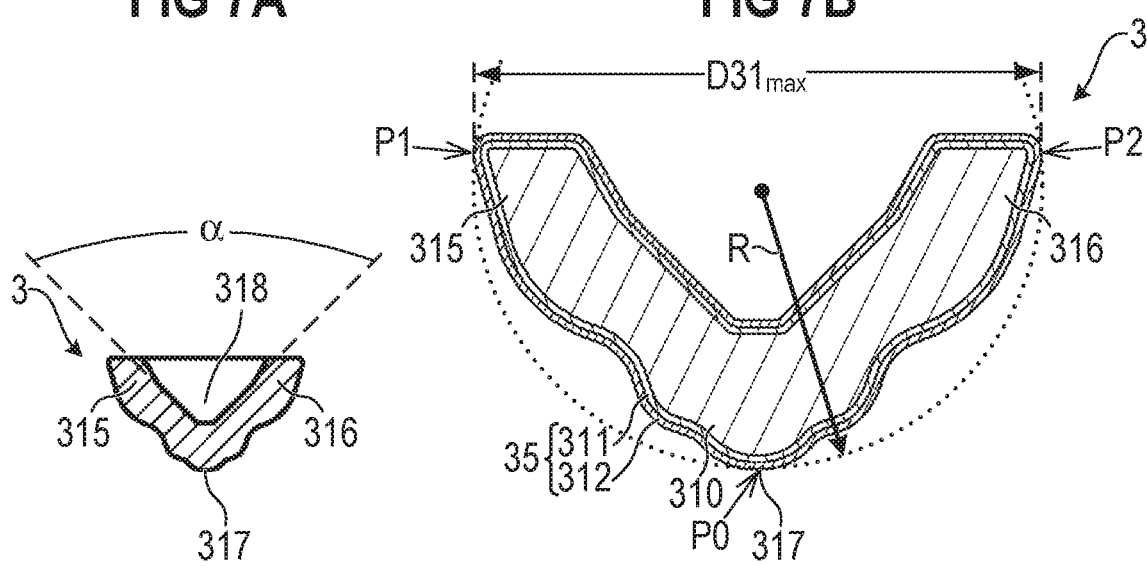
FIG 7C
FIG 8

ELECTRONIC MODULE WITH AN ELECTRICALLY CONDUCTIVE PRESS-FIT TERMINAL HAVING A PRESS-FIT SECTION

TECHNICAL FIELD

The instant disclosure relates to a method for electrically connecting an electronic module and to an electronic assembly.

BACKGROUND

Electric press-fit-connections, in which electric press-fit-terminals are pressed into corresponding electric contact holes, are widely used in electronics for electrically connecting two electric parts, e.g. an electronic module and a circuit board. When high currents flow across a press-fit-terminal, ohmic losses can cause high temperatures (e.g. about 200° C.) of the terminal and the adjacent regions of the electric parts. In addition to the related loss of energy, high temperatures at an electric press-fit-terminal can cause a deterioration of the terminal and the connected electric parts. In order to keep the ohmic losses and the related high temperatures low, press-fit-terminals are often made of low-ohmic materials. However, many low-ohmic materials have a low mechanical strength so that pressing a low-ohmic press-fit-terminal into a corresponding contact hole can cause an undesired deformation of the terminal. If the press-fit-terminal does not precisely fit in the corresponding contact opening, the press-fit-terminal may even be bent in an unintentional manner so that it cannot be pressed into the contact opening. A further problem that may occur with a press-fit-connection is that the electric contact resistance may increase over time.

Hence, a need has been identified for a method for electrically connecting an electronic module and an electric part using a low-ohmic press-fit-terminal that has a high mechanical strength and that allows for the formation of a press-fit-connection having a long lasting low transition resistance. A further need has been identified for an electronic module assembly in which an electric part is reliably electrically connected to an electronic module.

SUMMARY

In a method, an electronic module having an electric terminal and an electric part having a contact hole are provided. The electric terminal has a press-fit section that includes one of the following alloys: CuFeP; CuZr; CuCrZr; CuMg; CuCrTiSi; CuCrAgFeTiSi; CuNiSiMg. The press-fit section is pressed into the contact hole so that the press-fit section is plastically deformed, and both mechanically and electrically contacts the electric part.

An electronic assembly includes an electronic module and an electric part. The electronic module has an electric terminal having a press-fit section. The press-fit section includes at least one of the following alloys: CuFeP; CuZr; CuCrZr; CuMg; CtiCrTiSi; CuCrAgFeTiSi; CuNiSiMg. The electric part has a contact hole. The electronic assembly includes a press-fit connection between the press-fit section and the electric part. In that press-fit connection, the press-fit section both mechanically and electrically contacts the electric part.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and the description. The components in the figures are not necessarily to scale, emphasis instead being placed upon illustrating the principles of the invention. Moreover, in the figures, like reference numerals designate corresponding parts throughout the different views.

FIGS. 7A to 7C illustrate different views of a press-fit section of a press-fit terminal.

FIG. 8 is an enlarged view of FIG. 7C.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. As well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element".

Figure 1:
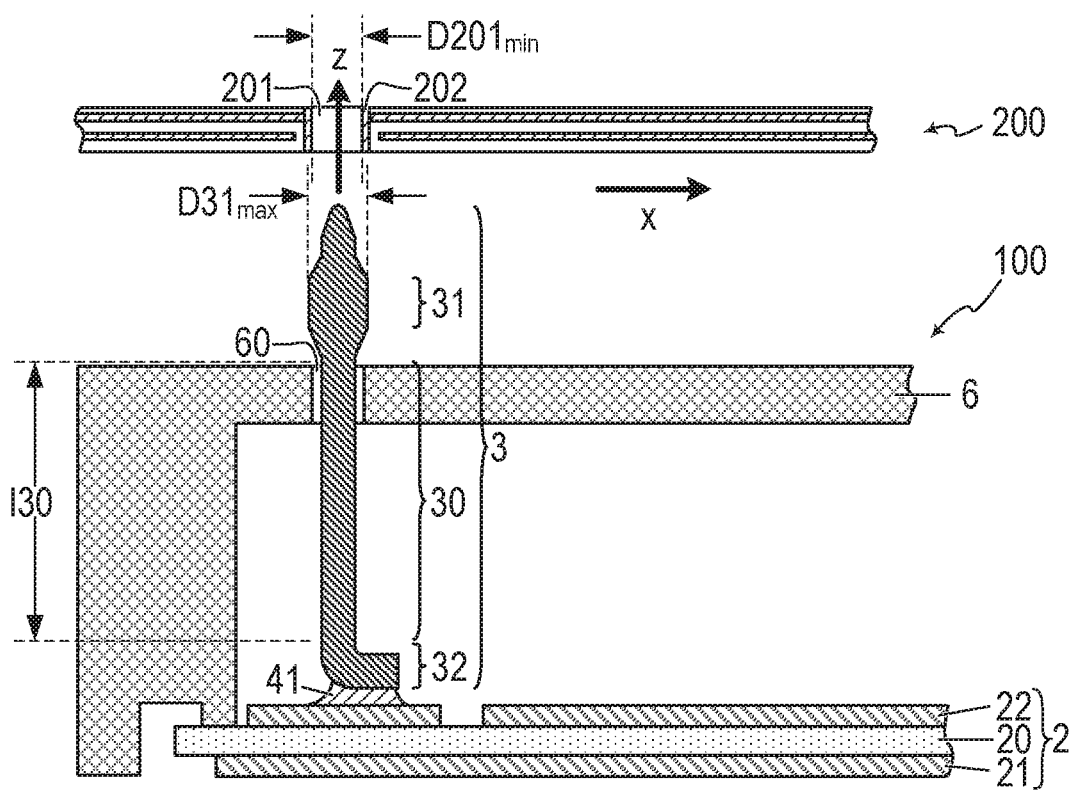
FIG. 1 is a cross-sectional side view of a section of an electronic module having a press-fit-terminal to be pressed into a contact opening of a circuit board.
Figure 2:
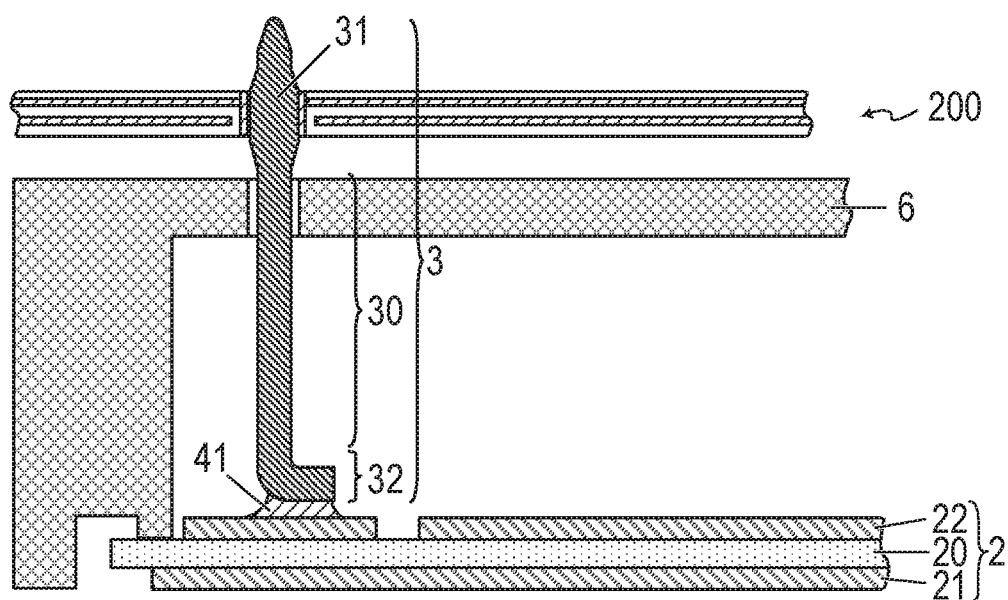
FIG. 2 is a cross-sectional side view of a section of an electronic module assembly in which the electronic module and the circuit board of FIG. 1 have been electrically connected by pressing the press-fit-terminal into the contact opening.

Referring to FIG. 1, an exemplary electronic module 100 includes an electrically conductive press-fit terminal 3 having a press-fit section 31, a module connection section 32, and an optional shaft 30 electrically and mechanically connecting the press-fit section 31 and the module connection section 32. The press-fit terminal 3 serves to electrically connect the electronic module 100 to an electric part 200 external to the electronic module 100. In the present example, the electric part 200 is, without being restricted to, a circuit board, e.g. a printed circuit board (PCB). In any case, the electric part 200 includes a contact hole 201 which may be a through hole (as shown), or, alternatively, a blind hole (not shown). In order to electrically connect the electronic module 100 and the electric part 200, the press-fit terminal 3 is, with its press-fit section 31, pressed into the contact hole 201. Thereby, the press-fit section 31 is plastically deformed and, at the contact hole 201, comes into electrical and physical contact with the electric part 200, e.g. with a surface metallization 202 of the contact hole 201. FIG. 2 shows the result with the press-fit section 31 pressed into the contact hole 201.

The plastic deformation is caused by an oversize of the press-fit section 31 relative to the contact hole 201 prior to pressing it into the contact hole 201. Prior to pressing the press-fit section 31 into the contact hole 201, the press-fit section 31 has a maximum lateral dimension $D31_{max}$ greater than a minimum lateral width $D201_{min}$ (to be measured in the same lateral direction x as the maximum lateral dimension $D31_{max}$) of the contact hole 201. For instance, a ratio $D31_{max} \div D201_{min}$ between $D31_{max}$ and $D201_{min}$ (to be measured, relative to the pressing direction z, in the same lateral direction x) may be in, without being restricted to, greater than 1 and less than or equal to 1.3, e.g. at least 1.05 and less than or equal to 1.3. If, for instance, the contact hole 201 has a circular cross-section, the minimum lateral width $D201_{min}$ is the minimum diameter of the contact hole 201. In this sense, a lateral dimension or width (and, therefore, a minimum or maximum lateral dimension) is to be determined perpendicularly to the pressing direction z of a force with which the press-fit section 31 is pressed into the contact hole 201.

The press-fit terminal 3 (or at least its press-fit section 31) includes or consists of one of the following alloys: CuFeP; CuZr; CuCrZr; CuMg; CuCrTiSi; CuCrAgFeTiSi; CuNiSiMg. The designations of these alloys are abbreviated and, in the sense of the present description and the claims, to be understood as follows (in each case, R designates one or more alloying constituents not explicitly mentioned in the respective alloy):

CuFeP means $Cu_aFe_bP_cR_d$ with
a≥96.82 weight %
b=2.1 to 2.6 weight %;
c=0.015 to 0.15 weight %;
d=0 to 0.43 weight %;
a+b+c+d=100 weight %.

CuZr means $Cu_aZr_bR_c$ with
a≥99.7 weight %;
b=0.1 to 0.2 weight %;
c=0 to 0.1 weight %;
a+b+c=100 weight %.

CuCrZr means $Cu_aCr_bZr_cR_d$ with
a≥98.32 weight %;
b=0.5 to 1.2 weight %;
c=0.03 to 0.3 weight %;
d=0 to 0.18 weight %;
a+b+c+d=100 weight %.

CuMg means $Cu_aMg_bR_c$ with
a≥98.6 weight %;
b=0.08 to 0.8 weight %;
c=0 to 0.6 weight %;
a+b+c=100 weight %.

CuCrTiSi means $Cu_aCr_bTi_cSi_dR_e$ with
a≥99.0 weight %;
b=0.15 to 0.4 weight %;
c=0.1 to 0.4 weight %;
d=0.02 to 0.07 weight %;
e=0 to 0.82 weight %;
a+b+c+d+e=100 weight %.

$Cu_aCr_bAg_cFe_dTi_eSi_fR_g$ with
a≥98.73 weight %;
b=0.2 to 0.7 weight %;
c=0.01 to 0.3 weight %;
d=0.02 to 0.2 weight %;
e=0.01 to 0.15 weight %;
f=0.01 to 0.1 weight %;
g=0 to 0.2 weight %;
a+b+c+d+e+f+g=100 weight %.

CuNiSiMg means $Cu_aNi_bSi_cMg_dR_e$ with
a≥93.25 weight %;
b=2.2 to 4.2 weight %;
c=0.25 to 1.2 weight %;
d=0.05 to 0.3 weight %;
e=0 to 3.75 weight %;
a+b+c+d+e=100 weight %.

The alloys mentioned above are shown to have low electrical resistivities, good thermal conductivities, and mechanical strengths low enough as to allow for the mentioned plastic deformation but high enough as to prevent the press-fit terminal 3 from being undesirably deformed during the press-fit process. After the press-fit section 31 has been pressed into the contact hole 201 and thereby plastically deformed, the plastically deformed press-fit section 31 still has a remaining elasticity sufficient to ensure a long lasting low electrical transition resistance between the press-fit terminal 3 and the metallization 202 of the contact hole 201. The mentioned alloys allow for a reduction of the temperatures of the press-fit terminal 3 and the electric part 200, and an increased power density of the electronic module 100. In an experiment, geometrically identical press-fit terminals made of different alloys were investigated with respect to the temperatures of the terminals resulting from different currents through the respective terminal. For instance, many circuit boards that may be used as circuit board 200 have a maximum rated temperature of 105° C. In order to prevent the temperature of a conventional terminal (made of CuSn4) from exceeding 105° C., the current through the terminal had to be limited to 32 A, whereas for CuMg and CuCrZr (i.e. materials used in connection with the present description) the current had to be limited to 48 A (CuMg) and 58 A (CuCrZr), That is, compared to conventional CuSn4, the ampacity could be increased by a factor of about 1.5 or 1.8.

As illustrated in FIGS. 1 and 2, the electronic module 100 may have a module housing 6. The module housing 6 may be dielectric (e.g. consist of or include a thermosetting or thermoplastic material) in order to provide for a good electric insulation. However, the module housing 6 may be electrically conductive. If the electronic module includes a module housing 6, the press-fit terminal 3 may be routed through a passage opening 60 of the module housing 6 so that the press-fit section 31 is disposed outside the module housing 6 and that the module connection section 32 is disposed inside the module housing 6. As illustrated in the present example, the module housing 6 may have a lid section that runs substantially parallel to the substrate 2, and the press-fit terminal 3 may be routed through a passage opening 60 formed in the lid section. However, the lid section may be omitted. In any case, the press-fit section 31 is accessible from outside the electronic module 100.

Optionally, the electronic module 100 may include a circuit carrier 2, e.g. a ceramic substrate as illustrated. The circuit carrier 2 includes a dielectric layer 20 (which is, in case of a ceramic substrate 2, a ceramic layer), a first substrate metallization layer 21 and an optional second substrate metallization layer 22. The first substrate metallization layer 21 is attached to a first surface of the dielectric layer 20, and the second substrate metallization layer 22 (if provided) is attached to a second surface of the dielectric layer 20 opposite the first surface. As illustrated, the first substrate metallization layer 21 may be patterned to include at least two conductor tracks disposed distant from one another so that an electronic circuit can be realized by mounting and electrically interconnecting electronic components on the circuit carrier 2. That is, the circuit carrier 2 may be an electronic circuit board. According to a further option that is also illustrated in FIGS. 1 and 2, the press-fit section 31 may be disposed at that side of the electronic module 100 that is opposite the circuit carrier 2.

A dielectric ceramic layer 20 may be made of any dielectric ceramic material, e.g. alumina ($Al_2O_3$), aluminum nitride (AlN) or silicon nitride ($Si_3N_4$), so that it can provide for an electrical insulation between the first substrate metallization layer 21 and the second substrate metallization layer 22. If it is desired that the ceramic layer 20 electrically insulates the first substrate metallization layer 21 from the second substrate metallization layer 22, it may be free of electrically conductive vias. Alternatively, however, the ceramic layer 20 of a ceramic substrate 2 may include one or more electrically conductive vias electrically connecting the first substrate metallization layer 21 and the second substrate metallization layer 22.

The first substrate metallization layer 21 and the second substrate metallization layer 22 may include any metal or alloy, e.g. copper, a copper alloy, aluminum, or an aluminum alloy, and be attached to opposite surfaces of the ceramic layer 20 using any joining technique, e.g. brazing, direct copper bonding (DCB) or direct aluminum bonding (DAB).

As also illustrated in FIGS. 1 and 2, the press-fit terminal 3 is, at its module connection section 32, electrically connected to a further element of the electronic module 100. In the example of FIGS. 1 and 2, the press-fit terminal 3 is electrically connected to the first substrate metallization layer 21 using an electrically conductive first joining layer 41 that adjoins both the first substrate metallization layer 21 and the module connection section 32. For instance, the first joining layer 41 may be a solder layer, a layer including a sintered metal (e.g. silver) powder, or a layer of an electrically conductive adhesive.

Figure 3:
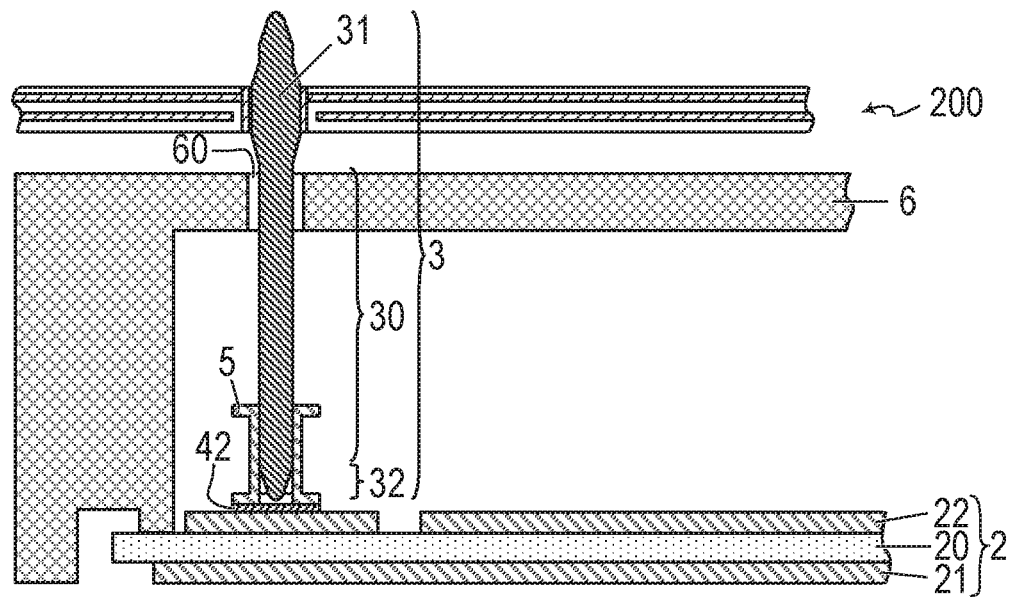
FIG. 3 is a cross-sectional side view of a section of an electronic module assembly in which a press-fit-terminal is plugged in a sleeve mounted on a circuit carrier of the electronic module.
Figure 4:
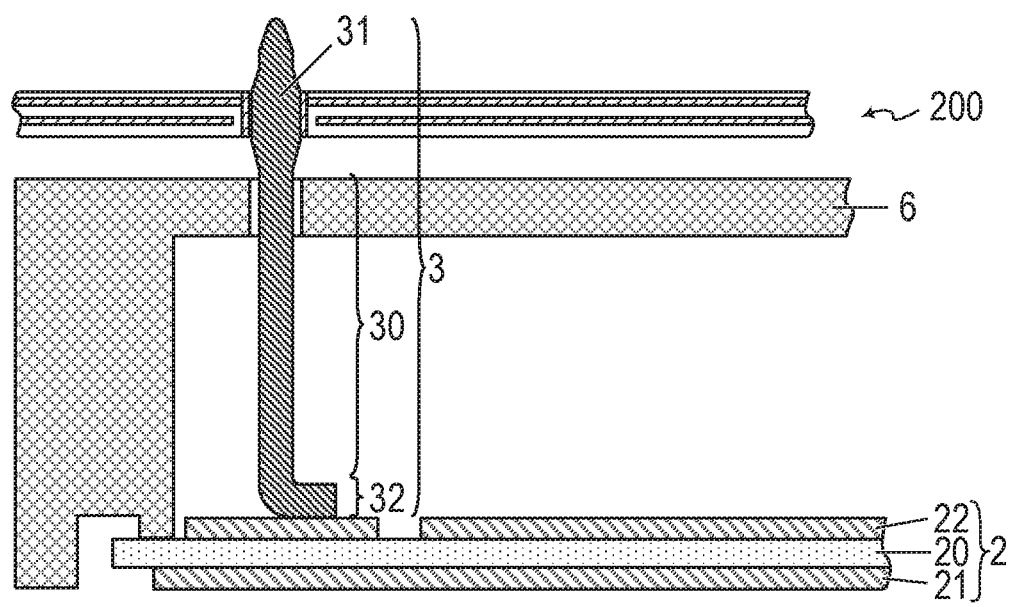
FIG. 4 is a cross-sectional side view of a section of an electronic module assembly in which a press-fit-terminal has been electrically connected to a circuit carrier of the electronic module by ultrasonic welding or resistance welding.

Alternatives for electrically connecting the press-fit terminal 3 at its module connection section 32 to a further element of the electronic module 100 are illustrated in FIGS. 3 and 4.

According to the example of FIG. 3, an electrically conductive sleeve 5 may be mounted on and electrically connected to the first substrate metallization layer 21 using an electrically conductive second joining layer 42 that adjoins both the first substrate metallization layer 21 and the sleeve 5. For instance, the second joining layer 42 may be a solder layer, a layer including a sintered metal (e.g. silver) powder, or a layer of an electrically conductive adhesive. At its module connection section 32, the press-fit terminal 3 is pressed into the sleeve 5 so that the module connection section 32 electrically and mechanically contacts the sleeve 5.

Figure 5:
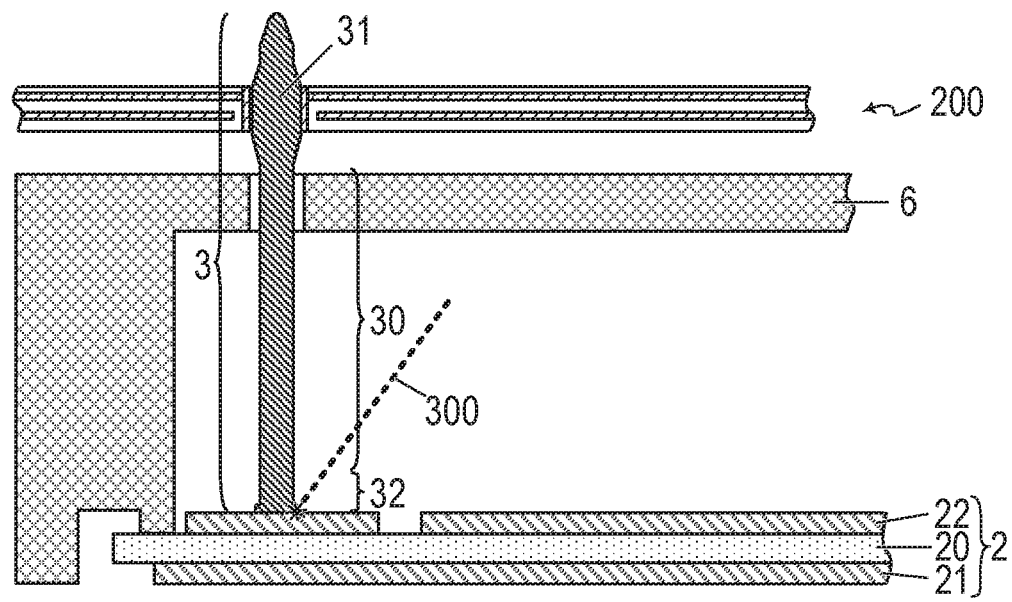
FIG. 5 is a cross-sectional side view of a section of an electronic module assembly in which a press-fit-terminal is electrically connected to a circuit carrier of the electronic module by laser welding.

According to the examples of FIGS. 4 and 5, the module connection section 32 of the press-fit terminal 3 may be directly connected to the first substrate metallization layer 21 by welding, e.g. by ultrasonic or resistance welding (FIG. 4), or by laser welding using a laser beam 300 (FIG. 5). In FIG. 5, the laser beam 300 is illustrated in dashed fashion in order to illustrate that the welding process took place prior to pressing the press-fit terminal 3 into the contact hole 201.

Instead of electrically connecting the press-fit terminal 3 at its module connection section 32 to the first substrate metallization layer 21, the same techniques may be used to electrically connect the press-fit terminal 3 at its module connection section 32 to any other electrical element of the electronic module 100, e.g. to a terminal metallization layer of a semiconductor chip that is disposed inside the module housing 6 and mounted on the circuit carrier 2.

Irrespective of the type of electrical connection between the press-fit terminal 3 and the first substrate metallization layer 21, the connection may be formed prior to or after attaching the module housing 6 to the substrate 2.

Figure 6:
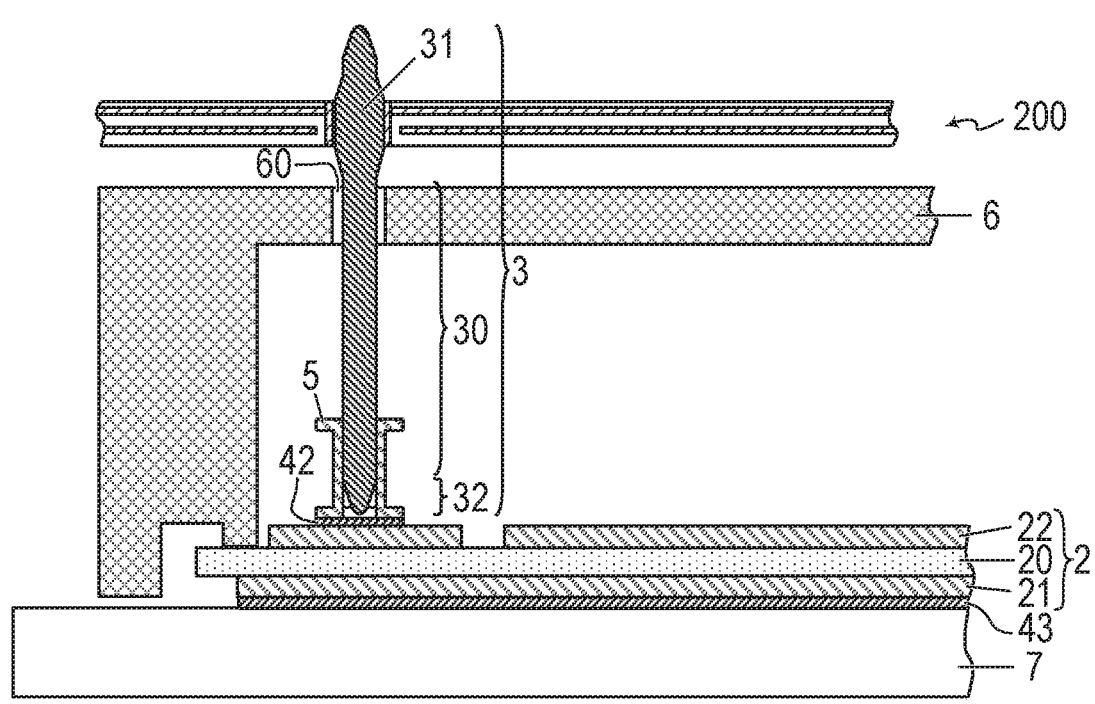
FIG. 6 is a cross-sectional side view of a section of an electronic module assembly which differs from the electronic module assembly of FIG. 2 in that the electronic module includes a baseplate.

According to a further option illustrated in FIG. 6, the electronic module 100 may include a rigid base plate 7, and a third joining layer 43 that joins the circuit carrier 2 (e.g. the second substrate metallization layer 22) and the base plate 7 and adjoins both of them. For instance, the third joining layer 43 may be a solder layer, a layer including a sintered metal (e.g. silver) powder, or a layer of an electrically conductive or electrically insulating adhesive. The base plate 7 mechanically stabilizes the circuit carrier 2. For instance, the base plate 7, which may have a thickness of at least 2 mm, may be made of metal, or of a metal matrix composite (MMC) material (e.g. AlSiC). Even though the example of FIG. 6 is based on the example of FIG. 3, any other electronic module 100 may include such a base plate 7 that is joined to the circuit carrier 2 using a third joining layer 43 as described.

The press-fit terminal 3 may electrically and mechanically be connected at its module connection section 32 to the further element (in the illustrated examples, the further element is the first substrate metallization layer 21) of the electronic module 100 prior to pressing its press-fit section 31 into the contact hole 201. The press-fit terminal 3 may be pre-fabricated so that, after it has been connected at its module connection section 32 to the further element, no material needs to be removed from the press-fit terminal 3. According to one option, the press-fit terminal 3 may be pre-fabricated to its final shape so that, after it has been connected at its module connection section 32 to the further element, no reshaping (e.g. bending, embossing) of the press-fit terminal 3 is required. According to a different option, the press-fit terminal 3 may be pre-fabricated and, after it has been connected at its module connection section 32 to the further element, reshaped (e.g. by bending and/or embossing).

Producing a pre-fabricated press-fit terminal 3 may be carried out by stamping a sheet section out of a sheet metal, and, (if desired) subsequently reshaping the sheet section (e.g. by bending and/or embossing). As an alterative, a pre-fabricated press-fit terminal 3 may be produced by cutting a wire section from a metal wire (e.g. produced by wire drawing) and, (if desired) subsequently reshaping the wire section (e.g. by bending and/or embossing).

The press-fit terminal 3 or at least its shaft 30 was found to have an ideal tensile strength in the range from 520 MPa to 720 MPa (at 23° C.; according to DIN EN ISO 6892-1: 2017-02). For a particular alloy, the tensile strength may, to a certain extent, be adapted to a desired tensile strength by employing one or more forming processes, e.g. by rolling, extruding, and/or by annealing. If the tensile strength is significantly lower than 520 MPa, there is a risk that the press-fit terminal 3 will be distorted in an undesired manner, and if the tensile strength significantly exceeds 720 MPa, there is a risk that the contact hole 201 will be damaged.

According to another option, the press-fit terminal 3 or at least its shaft 30 may have an elongation at break in the range from 2% to 8% (at 23° C.; according to DIN EN ISO 6892-1:2017-02). For a particular alloy, the elongation at break may, to a certain extent, be adapted to a desired tensile strength by employing one or more forming processes, e.g. by rolling, extruding, and/or by annealing. If the elongation at break is lower than 2%, there is a risk that the press-fit terminal 3 will crack when it is pressed into the contact hole 201, and if the elongation at break exceeds 8%, the press-fit terminal 3 is comparatively soft so that there is no sufficient contact pressure with which the press-fit section 31 is pressed against the metallization 201.

If the press-fit terminal 3 has a shaft 30, the shaft 30 may optionally be straight. For instance, the shaft 30 may be longish and have, in a cross-sectional plane perpendicular to its longitudinal direction, a substantially rectangular or square cross-section, i.e. the cross-section may be a rectangle or square having rounded edges. The length 130 of the shaft 30 may be in, without being restricted to, a range from 5 mm to 20 mm.

A press-fit terminal as described herein may even be used in connection with a small contact hole 201, e.g. a contact hole 201 having a width or diameter D201 of less than or equal to 1.09 mm, e.g. for a contact hole 201 having a width or diameter D201 of at least 0.9 mm and of less than or equal to 0.9 mm, e.g. of at least 0.94 mm and of less than or equal to 1.09 mm. However, it is to be noted that a width or diameter D201 of less than 0.9 mm or of more than 1.09 mm may also be used.

FIG. 7A illustrates a side view of a press-fit section 31 that may be used in connection with any of the examples explained above. FIG. 7B shows a further side view, and FIG. 7C shows a cross-section taken in a direction perpendicular to the direction z of a force with which the press-fit section 31 is pressed into the contact hole 201 (i.e. the pressing direction z). This direction may be identical to the longitudinal direction of the shaft 30 (if provided). As can be seen from FIGS. 7A to 7C, the press-fit section 31 may have two legs (a first leg 315 and a second leg 316), a protrusion 317, and, opposite the protrusion 317, a recess 318. In FIG. 7B, the recess 318 is hidden behind the first leg 315 and, therefore, illustrated in dashed fashion. FIG. 8 is an enlarged view of FIG. 7C.

In the cross-sectional plane of FIGS. 7C and 8, the legs 315 and 316 enclose an angle α different from 0° and different from 180° and therefore form spring. For instance, the angle α may be in, without being restricted to, a range from 85° to 95°. When inserting the press-fit section 31 into the contact hole 201, the press-fit section 31 is plastically deformed but remains, to a certain extent, elastic. The remaining elasticity is, inter alia, caused by the spring formed by the legs 315 and 316. That is, when inserting the press-fit section 31 into the contact hole 201, the spring formed by the legs 315 and 316 is elastically pre-tensioned so that the legs 315 and 316 and the protrusion 317 are pressed against and electrically contact the metallization 202.

As illustrated in FIG. 8, the press-fit section 31 may have, perpendicularly to the pressing direction z, a largest circumcircle. A or the largest circumcircle is a or the circumcircle among all circumcircles of the press-fit section 31 perpendicularly to the pressing direction z having the largest diameter. In FIG. 8, a section of a maximum circumcircle is indicated by a dotted line having a radius $R_{max}$ (which may also be referred to as maximum circumcircle radius) and a diameter $D31_{max}=2 \cdot R_{max}$ (the diameter $D31_{max}$ may also be referred to as maximum circumcircle diameter). Optionally, a maximum circumcircle may include a point P0 on the surface of the protrusion 317, a point P1 on the surface of the first leg 315, and a point P2 on the surface of the second leg 316. A ratio $D31_{max} \div D201_{min}$ may be in, without being restricted to, a range from 1.05 to 1.3.

According to a further option also illustrated in FIG. 8, the press-fit terminal 3 or at least its press-fit section 31 may have a core region 310, and an electrically conductive surface coating 35 formed on the core region 310. Such a surface coating 35 may serve to prevent a surface oxidation of the press-fit terminal 3 or at least of the press-fit section 31, and/or facilitate the formation of cold-welding connection between the metallization 202 and the press-fit section 31 after the press-fit section 31 has been pressed into the contact hole 201. A surface coating 35 may include at least one coating layer. In the present example, the surface coating 35 includes a first coating layer 311 and a second coating layer 312. The first coating layer 311 consists of or includes nickel (Ni; layer thickness e.g. 1 µm to 2 µm), and the second coating layer 312 consists of or includes tin (Sn; layer thickness e.g. 0.5 µm to 2 µm). The first coating layer 311 is disposed between and adjoins both the core region 310 and the second coating layer 312. If the press-fit terminal 3 or at least its press-fit section 31 has a surface coating 35, the surface coating 35 makes contact with the metallization 202 of the contact hole 201 when the press-fit section 31 is pressed into the contact hole 201. The first coating layer 311 is disposed between and adjoins both the core region 310 and the second coating layer 312. Alternatively or additionally to a first coating layer 311 consisting of or including nickel (Ni) and a second coating layer 312 consisting of or including tin (Sn), a surface coating 35 may include at least one coating layer that includes or consists of a noble metal, e.g. gold (Au) or palladium (Pd). A suitable layer thickness of a surface coating is, without being restricted to, from 1.5 µm to 4 µm. The core region 310 may consist of or include one of the alloys (CuFeP; CuZr; CuCrZr; CuMg; CuCrTiSi; CuCrAgFeTiSi; CuNiSiMg) mentioned above. A suitable method for applying the surface coating 35 to the core region 310 is, e.g., galvanic plating. However, it is to be noted that the surface coating 35 may be omitted so that the press-fit terminal 3 consists of the core region 310 consisting of or including one of the alloys (CuFeP; CuZr; CuCrZr; CuMg; CuCrTiSi; CuCrAgFeTiSi; CuNiSiMg) mentioned above.

In the previous examples, the electric part 200 has been described as a circuit board. However, the electric part 200 may also be a metal plate or a metal bar, a further electronic module (e.g. an inverter module, a capacitor module, a control unit for controlling the electronic module 100, etc.), or any other electronic unit.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A method, comprising:
   providing an electronic module comprising an electrically conductive press-fit terminal, the electrically conductive press-fit terminal comprising a press-fit section;
   providing an electric part comprising a contact hole, the press-fit section having a maximum lateral dimension greater than a minimum lateral width of the contact hole as measured in a same lateral direction as the maximum lateral dimension of the press-fit section; and pressing the press-fit section into the contact hole such that the press-fit section plastically deforms, and both mechanically and electrically contacts the electric part, wherein the press-fit section comprises a first leg, a second leg, a protrusion, and a recess opposite the protrusion.

2. The method of claim 1, wherein prior to the pressing of the press-fit section into the contact hole, a ratio of the maximum lateral dimension of the press-fit section to the minimum lateral width of the contact hole is greater than 1 and less than or equal to 1.3.

3. The method of claim 1, wherein the contact hole has a circular cross-section, wherein the minimum lateral width of the contact hole is a minimum diameter of the contact hole, and wherein the maximum lateral dimension of the press-fit section and the minimum lateral width of the contact hole are determined perpendicularly to a pressing direction of a force with which the press-fit section is pressed into the contact hole.

4. The method of claim 1, wherein the electrically conductive press-fit terminal is made of a Cu-containing alloy.

5. The method of claim 4, wherein the Cu-containing alloy is one of CuFeP, CuZr, CuCrZr, CuMg, CuCrTiSi, CuCrAgFeTiSi, and CuNiSiMg.

6. The method of claim 1, wherein the electrically conductive press-fit terminal further comprises a module connection section and the electronic module further comprises a housing, the method further comprising:
routing the electrically conductive press-fit terminal through a passage opening of the housing such that the press-fit section is disposed outside the housing and the module connection section is disposed inside the housing.

7. The method of claim 1, further comprising:
attaching a module connection section of the electrically conductive press-fit terminal to a circuit carrier of the electronic module or to a terminal metallization layer of a semiconductor chip mounted on the circuit carrier.

8. The method of claim 7, wherein the attaching of the module connection section comprises:
joining the module connection section to the circuit carrier via a solder layer, a layer including a sintered metal powder, or a layer of an electrically conductive adhesive.

9. The method of claim 7, wherein the attaching of the module connection section comprises:
pressing the electrically conductive press-fit terminal into a sleeve mounted on and electrically connected to the circuit carrier, such that the module connection section electrically and mechanically contacts the sleeve.

10. The method of claim 7, wherein the attaching of the module connection section comprises:
connecting the module connection section to a substrate metallization layer of the circuit carrier by welding.

11. The method of claim 10, wherein the welding comprises ultrasonic welding, resistance welding, or laser welding.

12. The method of claim 7, wherein the electronic module further comprises a rigid base plate, the method further comprising:
attaching the circuit carrier to the rigid base plate via a joining layer.

13. The method of claim 7, wherein the electrically conductive press-fit terminal is pre-fabricated such that, after the module connection section is attached to the circuit carrier or to the terminal metallization layer of the semiconductor chip mounted on the circuit carrier, no material is removed from the electrically conductive press-fit terminal.

14. The method of claim 1, wherein the first and the second legs of the press-fit section enclose an angle different from 0° and different from 180° and form a spring, and wherein when pressing the press-fit section into the contact hole, the spring is elastically pre-tensioned such that the first and the second legs and the protrusion are pressed against and electrically contact a metallization of the electric part.

15. An electronic assembly, comprising:
an electronic module comprising an electrically conductive press-fit terminal, the electrically conductive press-fit terminal comprising a press-fit section; and
an electric part comprising a contact hole,
wherein the press-fit section is inserted in the contact hole and plastically deformed therein, such that the press-fit section both mechanically and electrically contacts the electric part in the plastically deformed state,
wherein the press-fit section comprises a first leg, a second leg, a protrusion, and a recess opposite the protrusion.

16. The electronic assembly of claim 15, wherein the electrically conductive press-fit terminal is made of a Cu-containing alloy.

17. The electronic assembly of claim 16, wherein the Cu-containing alloy is one of CuFeP, CuZr, CuCrZr, CuMg, CuCrTiSi, CuCrAgFeTiSi, and CuNiSiMg.

18. The electronic assembly of claim 15, wherein the electrically conductive press-fit terminal further comprises a module connection section, wherein the electronic module further comprises a housing, and wherein the electrically conductive press-fit terminal is routed through a passage opening of the housing such that the press-fit section is disposed outside the housing and the module connection section is disposed inside the housing.

19. The electronic assembly of claim 18, wherein the electrically conductive press-fit terminal further comprises a shaft electrically and mechanically connecting the press-fit section and the module connection section.

20. The electronic assembly of claim 15, wherein a module connection section of the electrically conductive press-fit terminal is attached to a circuit carrier of the electronic module or to a terminal metallization layer of a semiconductor chip mounted on the circuit carrier.

21. The electronic assembly of claim 20, wherein the electrically conductive press-fit terminal is pressed into a sleeve mounted on and electrically connected to the circuit carrier, such that the module connection section electrically and mechanically contacts the sleeve.

22. The electronic assembly of claim 20, further comprising:
a rigid base plate to which the circuit carrier is attached via a joining layer.

23. The electronic assembly of claim 15, wherein the first and the second legs of the press-fit section enclose an angle different from 0° and different from 180° and form a spring, and wherein the first and the second legs and the protrusion are pressed against and electrically contact a metallization of the electric part via tension applied by the spring.

24. The electronic assembly of claim 15, wherein the press-fit section comprises a core region and an electrically conductive surface coating formed on the core region.

25. An electronic assembly, comprising:
an electronic module comprising an electrically conductive press-fit terminal, the electrically conductive press-fit terminal comprising a press-fit section; and
an electric part comprising a contact hole,
wherein the press-fit section is inserted in the contact hole and plastically deformed therein, such that the press-fit section both mechanically and electrically contacts the electric part in the plastically deformed state,
wherein a module connection section of the electrically conductive press-fit terminal is attached to a circuit carrier of the electronic module or to a terminal metallization layer of a semiconductor chip mounted on the circuit carrier,
wherein the electrically conductive press-fit terminal is pressed into a sleeve mounted on and electrically connected to the circuit carrier, such that the module connection section electrically and mechanically contacts the sleeve.

26. A method, comprising:
providing an electronic module comprising an electrically conductive press-fit terminal, the electrically conductive press-fit terminal comprising a press-fit section;
providing an electric part comprising a contact hole, the press-fit section having a maximum lateral dimension greater than a minimum lateral width of the contact hole as measured in a same lateral direction as the maximum lateral dimension of the press-fit section;
pressing the press-fit section into the contact hole such that the press-fit section plastically deforms, and both mechanically and electrically contacts the electric part; and
attaching a module connection section of the electrically conductive press-fit terminal to a circuit carrier of the electronic module or to a terminal metallization layer of a semiconductor chip mounted on the circuit carrier,
wherein the attaching of the module connection section comprises pressing the electrically conductive press-fit terminal into a sleeve mounted on and electrically connected to the circuit carrier, such that the module connection section electrically and mechanically contacts the sleeve.

* * * * *